United States Patent [19]

Lenk et al.

[11] 4,091,232
[45] May 23, 1978

[54] LOW MICROPHONIC CIRCUIT HOUSING

[75] Inventors: Gerd Gerry Lenk, Arlington Heights; Robert Allen Paul, Hanover Park, both of Ill.

[73] Assignee: Motorola, Inc., Schaumburg, Ill.

[21] Appl. No.: 706,417

[22] Filed: Jul. 19, 1976

[51] Int. Cl.² .............................................. H05K 5/04
[52] U.S. Cl. .............................. 174/52 R; 174/35 R; 331/68; 188/1 B
[58] Field of Search .......................... 174/52 R, 35 R; 206/521; 331/68; 325/355, 356, 361; 200/301; 361/399, 417, 424; 181/198, 200, 202, 205; 188/1 B

[56] References Cited

U.S. PATENT DOCUMENTS

| | | | |
|---|---|---|---|
| 1,616,176 | 2/1927 | Bremer | 188/1 B X |
| 3,621,478 | 11/1971 | Johnson et al. | 333/10 |
| 3,631,297 | 12/1971 | Conner | 188/1 B X |
| 3,739,298 | 6/1973 | Kawakami | 331/68 X |
| 3,813,582 | 5/1974 | Gikow | 188/1 B X |
| 3,950,603 | 4/1976 | Brefka | 174/52 R X |
| 4,053,943 | 10/1977 | Galvin | 188/1 B X |

Primary Examiner—Elliot A. Goldberg
Assistant Examiner—D. A. Tone
Attorney, Agent, or Firm—James P. Hamley; James W. Gillman

[57] ABSTRACT

The housing includes a casting formed with a provided cavity for receiving and supporting therein a high frequency circuit fabricated on a ceramic substrate. A cover portion is adapted to be affixed to the casting to seal off the cavity. Both the cover and casting are made from an electrical conducting but acoustically dampening material. Rigid standoffs with rubber bumpers at one end extend from the cover portion into the cavity such that when the cover is affixed to the casting the bumpers forcibly engage and compress against the circuit substrate thereby constraining the substrate against the casting. The amount of compression of the bumpers is controlled to minimize circuit microphonics caused by external mechanical shock.

5 Claims, 2 Drawing Figures

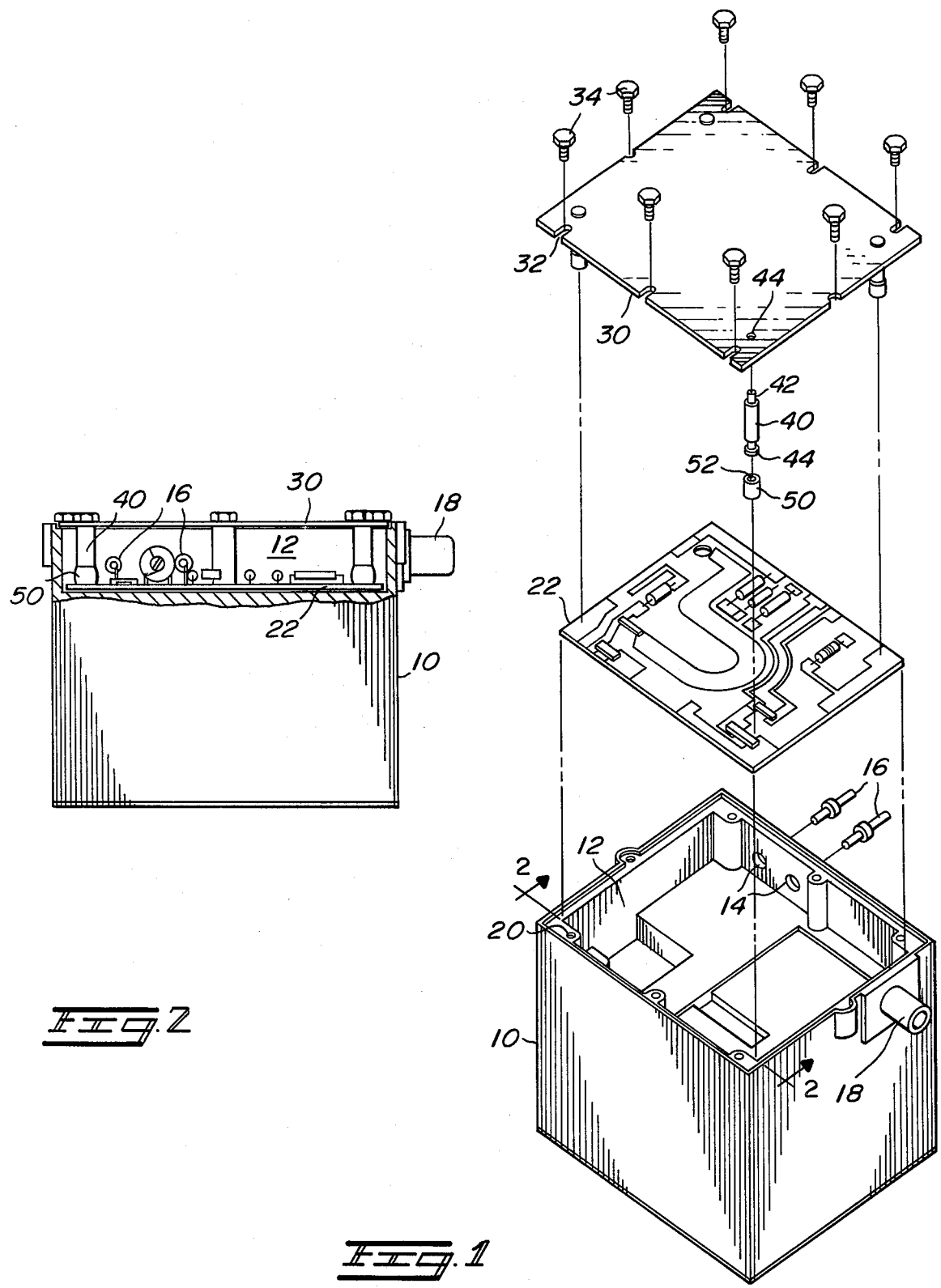

4,091,232

LOW MICROPHONIC CIRCUIT HOUSING

BACKGROUND OF THE INVENTION

The present invention pertains to the circuit housing art and, more particularly to a low microphonic circuit housing.

The need for a low microphonic circuit housing has been long felt, especially in the high frequency radio art, and particularly in the synthesizer field. There, for example, it is desirable to contain a very high frequency oscillator circuit, fabricated on a ceramic substrate, in a housing which isolates the circuit from external mechanical shock, thereby minimizing circuit microphonics. Microphonics are variations in the electrical performance of a circuit, for example, a change in the frequency of oscillation of an oscillator circuit, as a direct result from mechanical stress or vibrations imparted to sensitive components in the electrical circuit. This problem is especially acute at very high frequencies since any motion of a component in an RF field may frequency or phase modulate the RF circuit thereby inducing spurious modulation.

The prior art has developed two basic ways of minimizing microphonics in high frequency circuits. The first approach has been to use circuit components which are inherently immune to vibrational variations. In an oscillator, for example, it has been known that the use of crystals will greatly reduce the resulting circuit configuration from induced microphonics. However, this approach is not always commercially feasible due to the high cost of crystals.

A second, more common approach, is the use of microphonic sensitive circuit components in a totally encapsulated housing. Such an assembly normally includes a housing and cover portion which totally encase the circuit. An encapsulating material, such as epoxy foam, is used to completely fill the circuit casing thereby encapsulating all parts of the circuit within the casing structure. The resulting low microphonic assembly has the serious disadvantage that the circuit components are not accessible for adjustment or repair purposes.

SUMMARY OF THE INVENTION

It is an object of this invention, therefore, to provide an improved low microphonic circuit housing assembly which allows the use of low cost circuit components and provides a means of access to the components after completion of the assembly.

Briefly, according to the invention, the low microphonic assembly includes a housing with a provided cavity for receiving and supporting an electrical circuit board therein. A cover portion is provided which is adapted to be affixed, via suitable affixing means, to the housing to cover the housing cavity. A plurality of support members extend from the cover portion and are adapted for forcibly engaging the board with a predetermined compliance to constrain the board against the housing when the cover is affixed, via the affixing means to the housing.

The low microphonic characteristic of the assembly is enhanced if the housing is formed of a single cast unit and if both the housing and cover are formed of an acoustically dampening material.

BRIEF DESCRIPTION OF THE DRAWINGS

FIG. 1 is an exploded, perspective view showing the construction of the low microphonic housing assembly; and FIG. 2 is a cross sectional view of the assembled low microphonic circuit housing.

DETAILED DESCRIPTION OF THE PREFERRED EMBODIMENT OF THE INVENTION

Referring to FIG. 1, the preferred construction of the low microphonic circuit assembly includes a housing 10 having a cavity, generally indicated at 12, provided in the upper surface thereof. The housing 10 is fabricated in a single casting of an acoustically dampening, but electrically conducting material. Also provided in the housing casting 10 are mounting holes 14 adapted for receiving a pair of feedthrough electrical studs 16. A female jack 18 is shown mechanically located and affixed to the casted housing 10 for providing electrical access to an enclosed electrical circuit, which is discussed hereinbelow. A plurality of tapped screw holes, one of which is indicated at 20 are provided at predetermined locations about the provided cavity 12.

A high frequency oscillator circuit 22 is comprised, in the well known manner, of a plurality of electrical components fabricated on a ceramic substrate material. In this, the preferred embodiment of the invention, the function of the circuit board 22 is that of a 450 megahertz oscillator. At this very high frequency any variations in the RF field around the electrical components on the circuit substrate 22 can cause a significant variation in oscillator tuning and, thus, the circuit is sensitive to microphonics.

A cover portion 30 is adapted to be affixed to the cast housing 10 for covering the provided cavity 12 therein. A number of screw slots, one of which is indicated at 32, are provided in the cover 30 such that a plurality of screws, one of which being indicated at 34, may be used as a means to affix the cover 30 to the cast housing 10 via each screw hole 20.

The low microphonic performance of the assembly may be enhanced if the cast housing 10 and cover portion 30 are fabricated of the same acoustically dampening material. In addition, the material may be selected to provide electrical isolation to the circuit board 22, that is the material should be an electrical conductor. An excellent choice for the material of the cover 30 and cast housing 10 is an alloy commercially known as Zamac.

A plurality of four support members extend from the corners of the cover portion 30. One support member is illustrated in exploded form and includes a rigid metallic standoff 40 having a first hollowed end 42 which is affixed to the cover portion 30 via a cover portion mounting hole 44 and by rolling over end 42. The remaining free end 44 of the rigid standoff 40 is machined to hold thereon a molded rubber bumper 50 having a partially hollowed central portion 52.

Construction of the circuit housing assembly is very simple. Firstly, a circuit substrate 22 is located within the cavity 12 of the casting 10 whereby its lower surface is flush against the lower surface of the cavity 12. Circuit connections from the feedthrough stud 16 and female jack 18 to the substrate 22 electrical components may be made via conventional wires. There is no need, however, to epoxy, solder, or otherwise affix the circuit substrate 22 within the casted housing 10.

The cover portion 30 is then located over the provided cavity 12 in the cast housing 10 and is affixed thereto via each one of the screws 34 being screwed through each provided slot 32 to the provided screw hole 20 in the housing 10.

Each rigid standoff 40 is of predetermined length, and each rubber bumper 50 is of predetermined dimension such that when the cover portion 30 is located over the cavity 12 and affixed to the housing 10 the bumper 50 forcibly engages and compresses against the circuit substrate 22, thereby constraining the substrate 22 against the cast housing 10. The compliance of the rubber bumper 50, and the compression thereof in the total assembly has a significant effect on the microphonic characteristics of the total assembly. It has been found that if a rubber bumper made of a material commercially known as Geon is compressed approximately 20% excellent microphonic isolation is provided by the housing assembly to the circuit components.

FIG. 2 is a cross sectional view of the completed circuit housing assembly illustrated in FIG. 1. Thus, the cast housing 10 is shown receiving and supporting the ceramic circuit substrate 22 within the casted housing provided cavity 12. A plurality of circuit components are illustrated as mounted to the circuit board 22. Electrical connection to the circuit board 22 is provided via the feedthrough electrical studs 16 and the female jack 18.

The cover portion 30 is shown affixed to the cast housing 10 thus encasing the circuit substrate 22 within the housing assembly.

Extending from the cover portion 30 are a plurality of support members, one of which is illustrated as comprising the rigid standoff 40 and rubber bumper 50. As discussed with reference to FIG. 1, the dimensions of the standoff 40 and of the rubber bumper 50 are such that when the cover portion 30 is affixed to the cast housing 10 the rubber bumper 50 forcibly engages the circuit substrate 22 thereby constraining the substrate and resulting in a controlled amount of compression of the rubber bumper.

Shock testing of the resulting circuit housing has verified that the total assembly provides excellent immunity to the encased circuit such that expensive, inherently microphonic free components, such as crystals, need not be used. Moreover, since the disclosed circuit housing displays extremely low microphonic characteristics it is not necessary to fully encapsulate the circuit within the housing thus providing a means of access to adjust or repair the enclosed circuit.

While a preferred embodiment of the invention has been described in detail, it should be understood that anyone of ordinary skill in the art could make many modifications or variations thereto, all of which fall within the true spirit and scope of the invention.

For example, while the preferred embodiment housed a ceramic substrate it should be understood that the inventive low microphonic housing might also house a printed circuit board construction or any one of a number of possible circuit constructions, all of which are generically referred to as "board" or "circuit board."

We claim:

1. A low microphonic housing assembly for an electrical circuit fabricated on a board, the assembly comprising:
    a housing with a provided cavity for receiving the supporting the board therein;
    a cover portion adapted to be affixed to said housing to cover said housing cavity, said housing being a single cast unit of a high acoustically dampening material;
    means for affixing the cover portion to the housing;
    a plurality of support members extending from said cover portion and adapted for forcibly engaging the board with a predetermined compliance to constrain the same against the housing when the cover is affixed, via the affixing means, to the housing.

2. The assembly of claim 1 wherein both the housing and the cover portion are fabricated out of a material which provides electrical shielding to the electrical circuit.

3. The assembly of claim 1 wherein each support member is comprised of a rubber bumper; a metallic standoff having one end affixed to the cover portion; and
    means for affixing the rubber bumper to the free end of the standoff.

4. An assembly for isolating a high frequency electrical circuit, which is fabricated on a board, from external mechanical shock, the assembly comprising:
    a cast housing fabricated from an acoustically dampened and electrically conducting material, said casting with a provided cavity adapted for receiving and supporting therein the circuit board;
    a cover portion fabricated from the same material as the cast housing and adapted to be affixed to the housing to cover the housing cavity;
    means for affixing the cover to the housing; and
    a plurality of support members extending from the cover portion and adapted for forcibly engaging the circuit board and constaining the same against the housing when the cover is affixed thereto, each support member including a compliant member to provide a predetermined compliance between the cover and the circuit board.

5. The assembly of claim 4 wherein each support member is comprised of a rigid standoff having a first end affixed to the cover and a second end extending to a predetermined location within the housing cavity when the cover is affixed to the housing; and
    each compliant member is a rubber bumper of predetermined dimension and adapted to be predeterminedly compressed between the second end of the rigid standoff and the circuit board when the cover portion is affixed to the housing.

* * * * *